TWO STAGE TRANSISTOR AMPLIFIER WITH
BROAD-BAND GAIN-EQUALIZING FEEDBACK
Filed Feb. 23, 1960
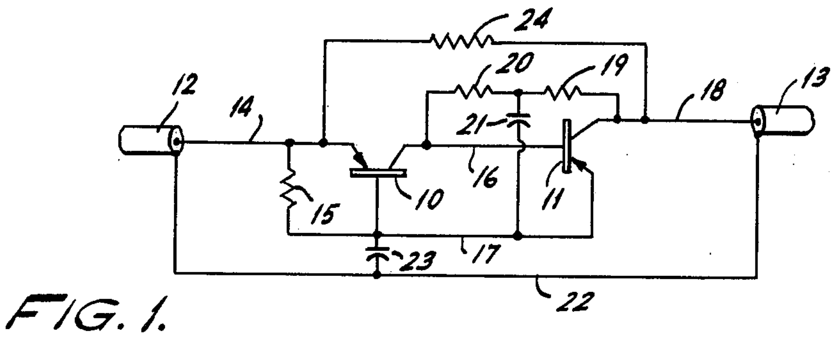
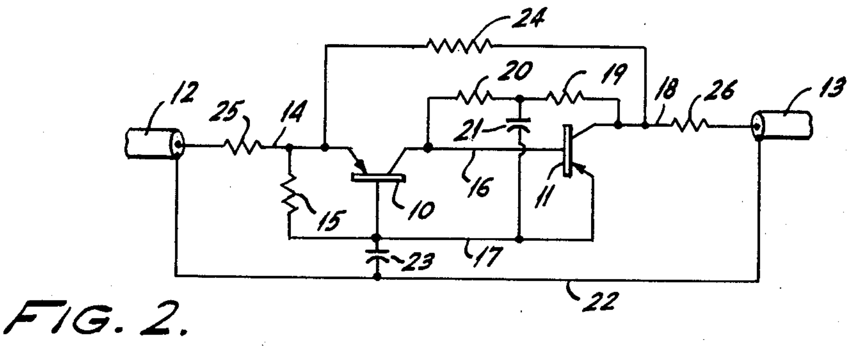
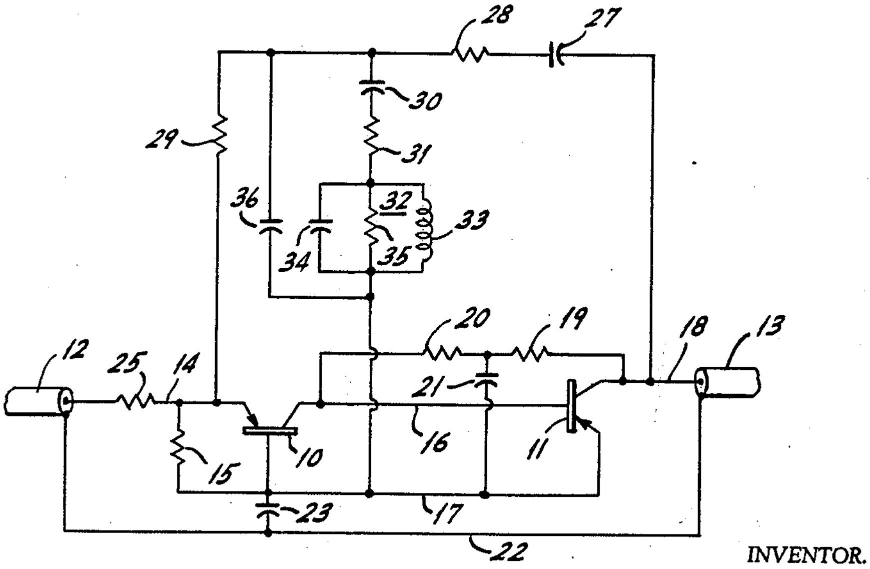
FIG. 3.
INVENTOR.
ROBERT S. DAHLBERG
BY
Fordyce A. Bothwell
ATTORNEY 3,124,759
Patented Mar. 10, 1964

3,124,759

TWO STAGE TRANSISTOR AMPLIFIER WITH BROAD-BAND GAIN-EQUALIZING FEEDBACK

Robert S. Dahlberg, Paoli, Pa., assignor, by mesne assignments, to Philco Corporation, Philadelphia, Pa., a corporation of Delaware Filed Feb. 23, 1960, Ser. No. 10,179
3 Claims. (Cl. 330—19)

This invention relates to signal amplifiers for use in signal transmission lines to compensate for the signal attenuation incident to transmission.

The transistor has made it possible to provide miniature amplifiers which may be used with miniature coaxial cable, i.e. coaxial cable of very small diameter. Thus a signal transmission system may comprise successive sections of miniature coaxial cable with miniature transistor amplifiers between the successive sections of the cable. For example, a system of ten miles length might comprise ten one-mile sections of miniature coaxial cable with miniature transistor amplifiers between the successive sections.

In any such system it is desired that the amplifiers shall have a wide passband and be capable of providing the required gain uniformly over said passband without objectionable signal distortion.

The principal object of the present invention is to provide an improved signal amplifier which meets the requirements of such a signal transmission system.

Another object of the invention is to provide an amplifier which is simple in construction and yet highly efficient in operation.

Still another object of the invention is to provide an amplifier which, because of its simplicity, is inexpensive to manufacture.

The invention may be fully understood from the following detailed description with reference to the accompanying drawing, wherein FIG. 1 is a schematic diagram of an amplifier constructed according to this invention;

FIG. 2 is a similar diagram of the same amplifier with the addition of impedance-matching resistors; and FIG. 3 is a similar diagram of the same amplifier with a more elaborate feedback arrangement.

Referring first to FIG. 1, it will be seen that the amplifier comprises a first transistor 10 in a common base stage and a second transistor 11 in a common emitter stage, the two stages being connected in cascade between sections 12 and 13 of a coaxial cable transmission line. A signal input conductor 14 is connected to the emitter of transistor 10. A biasing resistor 15 is connected between the emitter and base of transistor 10 and provides the base-emitter voltage. A connection 16 extends between the collector of transistor 10 and the base of transistor 11. A second connection 17 extends between the base of transistor 10 and the emitter of transistor 11. A signal output conductor 18 is connected to the collector of transistor 11. Bias resistors 19 and 20 are serially connected between the collector of transistor 11 and connection 16 and serve to supply bias potential to the base of transistor 11. A capacitor 21 is connected between the junction of resistors 19 and 20 and connection 17, and serves to prevent degenerative feedback from the collector to the base of transistor 11. A connection 22 extends between the outer conductors or sheaths of the coaxial cable sections 12 and 13. A capacitor 23 is connected between connections 17 and 22 and serves to place connection 17 at A.C. ground potential. A degenerative overall feedback connection including resistor 24 extends from the output conductor 18 to the input conductor 14.

In this amplifier the cascade arrangement of common base and common emitter stages gives a phase inversion of the signal from the input to the output which makes it possible to supply a relatively large amount of negative feedback by means of resistor 24 connecting the collector of the output transistor 11 to the emitter of the input transistor 10. This equalizes the gain over a broad band of frequencies.

An important feature of this amplifier is that it can be powered over the transmission line. Thus in a transmission line such as referred to above, all of the series-connected amplifiers may be powered over the transmission line.

If desired an impedance-matching resistor may be provided at the input or the output or both. Thus the same amplifier is shown in FIG. 2 with impedance matching resistors 25 and 26 at the input and output respectively. These serve to better match the input and output impedances of the amplifier to the impedances of the cable sections 12 and 13.

The same amplifier is shown in FIG. 3 with only one impedance-matching resistor 25 and with a more elaborate feedback arrangment. In this instance the overall feedback is by way of series-connected capacitor 27 and resistors 28 and 29. A shunt arm, connected between the junction of resistors 28 and 29 and connection 17, includes series-connected capacitor 30, resistor 31 and damped tuned circuit 32, the latter comprising parallel-connected inductor 33, capacitor 34 and resistor 35. A capacitor 36 is connected across the entire shunt arm.

In one physical embodiment of the amplifier as shown in FIG. 3 designed for operation over a frequency range of 300 cps. to 150 kc., the components are as follows:

| | |
|---|---|
| Transistors **10** and **11** | 2N495. |
| Resistor **15** | 180 ohms. |
| Resistor **19** | 1 kilohm. |
| Resistor **20** | 2.2 kilohms. |
| Capacitor **21** | 16 microfarads. |
| Capacitor **23** | 50 microfarads. |
| Resistor **25** | 33 ohms. |
| Capacitor **27** | 10 microfarads. |
| Resistor **28** | 82 ohms. |
| Resistor **29** | 82 ohms. |
| Capacitor **30** | 50 microfarads. |
| Resistor **31** | 120 ohms. |
| Capacitor **34** | 0.047 microfarad. |
| Resistor **35** | 220 ohms. |
| Capacitor **36** | 0.015 microfarad. |

The feedback arrangement of FIG. 3 gives a very uniform response over a wide frequency range. One reason for this is that with this arrangement the feedback changes with frequency to compensate for change of cable attenuation which is a function of frequency. As the line impedance at the amplifier input becomes smaller with increasing frequency, the feedback is decreased since more of the returned current is shunted from the amplifier.

With this feedback arrangement the response is uniform within 0.5 db from 300 cps. to 150 kc.

The tuned circuit 32 and capacitor 36 are added to the feedback arrangement to further improve the response. The tuned circuit is peaked at 35 kc. to remove a bulge in the gain. Capacitor 36 corrects a slight dip in the high frequency response.

While certain embodiments have been illustrated and described, it will be understood that the invention is not limited thereto but contemplates such further embodiments as may occur to those skilled in the art.

I claim:

1. In a signal amplifier, a first transistor having a base, an emitter and a collector, a signal input conductor connected to said emitter, a second transistor having a base, an emitter and a collector, a first connection between the collector of said first transistor and the base of said second transistor, a second connection between the base of said first transistor and the emitter of said second transistor, a signal output conductor connected to the collector of said second transistor, and feedback means comprising a series arm including a capacitor and two resistors serially connected between said output conductor and said input conductor, and a shunt arm including a capacitor and a resistor serially connected between the junction of said two resistors and said second connection.

2. A signal amplifier according to claim 1, wherein said shunt arm further includes a damped tuned circuit in series with said capacitor and said resistor.

3. A signal amplifier according to claim 2, wherein a capacitor is connected in parallel with the entire shunt arm.

References Cited in the file of this patent

UNITED STATES PATENTS

| | | |
|---|---|---|
| 2,760,007 | Lozier | Aug. 21, 1956 |
| 2,801,297 | Becking | July 30, 1957 |
| 2,955,258 | Wheatley | Oct. 4, 1960 |

FOREIGN PATENTS

| | | |
|---|---|---|
| 568,495 | Canada | Jan. 6, 1959 |

OTHER REFERENCES

Shea: "Principles of Transistor Circuits," September 1953, page 176.